United States Patent [19]
Alibocus et al.

[11] Patent Number: 5,627,108
[45] Date of Patent: May 6, 1997

[54] SOLDER PASTE AND GLUE DOT-BASED METHODS OF SECURING COMPONENTS TO A PRINTED CIRCUIT BOARD

[75] Inventors: Andrew A. Alibocus, Tomball; John F. Haarde, The Woodlands; Troy W. Beacleay, Houston; John Hua, Cypress; Mark A. Smith, Houston, all of Tex.

[73] Assignee: Compaq Computer Corporation, Houston, Tex.

[21] Appl. No.: 492,972

[22] Filed: Jun. 21, 1995

[51] Int. Cl.$^6$ ............................................. H01L 71/60
[52] U.S. Cl. ............................ 228/175; 29/840; 438/118; 156/277
[58] Field of Search .............................. 437/209, 210, 437/211, 212, 213, 214, 215, 216, 217, 218, 219, 220

[56] References Cited

U.S. PATENT DOCUMENTS

| | | | |
|---|---|---|---|
| 5,071,787 | 12/1991 | Mori et al. | 437/212 |
| 5,200,365 | 4/1993 | Culver | 437/209 |
| 5,352,926 | 10/1994 | Andrews | 437/209 |
| 5,369,880 | 12/1994 | Gundotra et al. | 437/209 |
| 5,385,869 | 1/1995 | Liu et al. | 437/214 |
| 5,498,575 | 3/1996 | Onishi et al. | 437/219 |
| 5,523,260 | 6/1996 | Missele | 437/217 |

*Primary Examiner*—Kevin Picardat
*Attorney, Agent, or Firm*—Konneker & Smith, P.C.

[57] ABSTRACT

Glue dots are deposited on a substrate side of a partially completed printed circuit board, between pairs of component mounting pads disposed on the substrate and having quantities of solder paste thereon, using a resilient stencil plate having a spaced series of glue discharge openings extending transversely therethrough, and a spaced series of side recesses. The recess side of stencil plate is positioned in a spaced, parallel and opposing relationship with the mounting pad side of the substrate with the plate recesses being aligned with the substrate mounting pads, and the glue discharge openings being aligned with glue leveling pads disposed on the substrate side between adjacent mounting pad pairs. Glue is deposited on the outer stencil plate side and a squeegee blade is moved along the outer stencil plate side to deflect it toward the substrate and force glue through the discharge openings to deposit glue dots thereon when the stencil plate is permitted to return to its undeflected position. As the plate is deflected, its depressions receive and provide clearance for the mounting pads so as not to disturb the solder paste quantities thereon. Electrical components are then pressed against pairs of mounting pads, and the glue dots therebetween, before being subjected to a final soldering process. In this manner the use of a needle type dispensing machine to deposit the glue dots is advantageously avoided.

16 Claims, 2 Drawing Sheets

SOLDER PASTE AND GLUE DOT-BASED METHODS OF SECURING COMPONENTS TO A PRINTED CIRCUIT BOARD

BACKGROUND OF THE INVENTION

1. Field of the Invention

The present invention generally relates to the fabrication of printed circuit boards and, in a preferred embodiment thereof, more particularly relates to methods for attaching components to printed circuit boards using solder paste and glue dots to operatively mount the components to the substrate portion of a printed circuit board.

2. Description of Related Art

One conventional method of operatively mounting electrical components on a side of a printed circuit board substrate is to deposit on the substrate side, for each of the typically large number of components to be mounted thereon, a spaced pair of solder paste portions on the substrate side and a small quantity of a suitable glue material (typically referred to as a glue "dot") disposed between the solder paste portions and spaced apart from each of them. Typically, the solder paste portions are placed on electrically conductive pads previously secured to the substrate side and operatively coupled to various electrically conductive lead structures that collectively form the electrical circuitry of the board.

After the solder paste portions and glue dots have been placed on the substrate side, the various components to be mounted on the substrate side are sequentially grasped by a high speed "pick and place" machine, moved into alignment with an associated solder paste portion pair and glue dot, pressed against the glue dot and solder paste portions, and then released. After all of the components have been placed on the substrate side (or sides, as the case may be) in this manner, the circuit board is subjected to a final soldering process to permanently secure the mounted components in place. The glue dots, of course, serve to hold the mounted components in place prior to this final soldering process.

Despite the wide use of this conventional component attachment technique as generally described above, it carries with it several well known problems, limitations and disadvantages arising from the method commonly used to apply the usual multiplicity of glue dots to the substrate side(s) prior to the mounting of the electrical components thereon—a single needle type glue dot dispensing machine. This machine functions to apply the requisite glue dots one-by-one via its needle-shaped discharge portion, the discharge portion being moved (typically under the control of a computer) horizontal to the circuit board to a glue dot location, inwardly toward the board to discharge a glue dot thereon, and then away from the board to repeat the cycle on another location thereon.

The problems, limitations and disadvantages of using a needle-type glue dot dispensing machine of this general type include: (1) inconsistently shaped glue dots; (2) an undesirably slow glue dot application rate (typically on the order of about 0.2 seconds/dot); (3) placement inaccuracies that can lead to the glue "stringing" between adjacent conductive pads and creating short circuits in the completed board; (4) missing glue dots created by a clogged dispensing needle; (5) a relatively large manufacturing floor space requirement for the dispensing machine; and (6) a complex computer programming requirement for each different circuit board upon which the dispensing machine is to place glue dots.

In view of the foregoing it can be seen that it would be desirable to provide an improved method for applying glue dots to a circuit board, during fabrication thereof, that eliminates or at least substantially reduces the above-mentioned problems, limitations and disadvantages associated with conventional needle-type glue dot dispensing machines. It is accordingly an object of the present invention to provide such an improved method.

SUMMARY OF THE INVENTION

In carrying out principles of the present invention, in accordance with a preferred embodiment thereof, a printed circuit board is fabricated without the previous necessity of using a needle type glue dispensing machine to deposit on the substrate portion of the board the multiplicity of glue dots needed to hold the electrical components on the substrate before the partially completed circuit board is subjected to a final soldering step such as a wave soldering process.

According to a preferred form of the invention, a partially fabricated printed circuit board is provided that includes a substrate member having a generally planar first side. Disposed on the first substrate member side are (1) a mutually spaced series of electrically conductive mounting pads each having an outer side facing transversely away from the first substrate member side, and (2) a mutually spaced series of glue leveling pads each disposed between and spaced apart from the mounting pads in a different adjacent pair thereof. Prior to the formation of glue dots on the first substrate member side, quantities of solder paste are deposited on the outer sides of the mounting pads.

To form the glue dots on the first substrate member side a specially designed resiliently deflectable stencil plate is provided, the stencil plate having opposite first and second sides, a spaced series of glue discharge openings each extending through the stencil plate between its first and second sides, and a spaced series of recesses formed in the first stencil plate side in a mutually spaced relationship with the glue discharge openings therein.

The stencil plate is representatively placed in an initial operating orientation in which its first side is in a spaced, parallel and opposing relationship with the first side of the substrate member, the glue discharge openings are aligned with the glue leveling pads, and the recesses in the first stencil plate side are aligned with the mounting pads on the first side of the substrate member. According to a key aspect of the present invention, each stencil plate recess is sized to receive its opposing mounting pad without disturbing the quantity of solder paste thereon.

Next, glue dots are deposited on the glue leveling pads by resiliently deflecting the stencil plate from its initial operating orientation toward the substrate member and a glue depositing orientation of the stencil plate while forcing a glue material through the glue discharge openings from the second stencil plate side. The deflected stencil plate is then permitted to return to its initial operating orientation. Preferably, this glue dot deposition step is performed by placing a quantity of glue on the second stencil plate side, and then forcing a suitable squeegee blade member against the second stencil plate side while moving the squeegee blade along the second stencil plate side in a manner forcing small quantities of the glue through the various glue discharge openings. During the resilient deflection of the stencil plate toward the first substrate member side, the stencil plate recesses receive and provide clearance for the mounting pads and the solder paste thereon so that the solder paste quantities are substantially undisturbed during the glue dot deposition process.

Alternatively, the stencil plate could be initially positioned against the first substrate member side (in an "on contact" mode"), with the stencil plate recesses receiving the mounting pads and the solder past quantities thereon, instead of the previously described "off contact" mode of the stencil plate in which the stencil plate is positioned outwardly of the substrate member and resiliently deflected toward it during glue deposition.

Electrical components are then positioned on the first substrate member side by pressing each component against a pair of the undisturbed solder paste quantities and a glue dot positioned therebetween. Next, the positioned electrical components are permanently secured to their associated mounting pads by subjecting them to a final soldering process.

DETAILED DESCRIPTION

Figure 1:
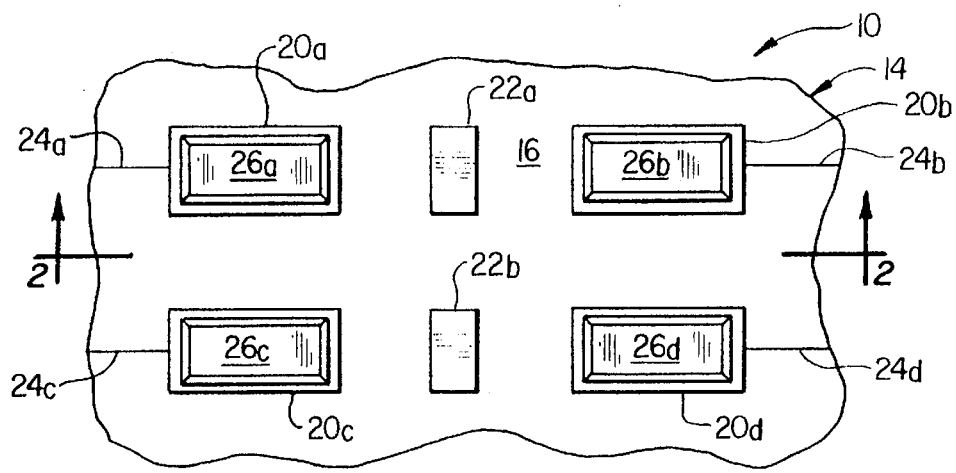
FIG. 1 is a top side elevational view of a portion of a representative, partially completed printed circuit board awaiting the application of glue dots thereto using a method embodying principles of the present invention.
Figure 2:
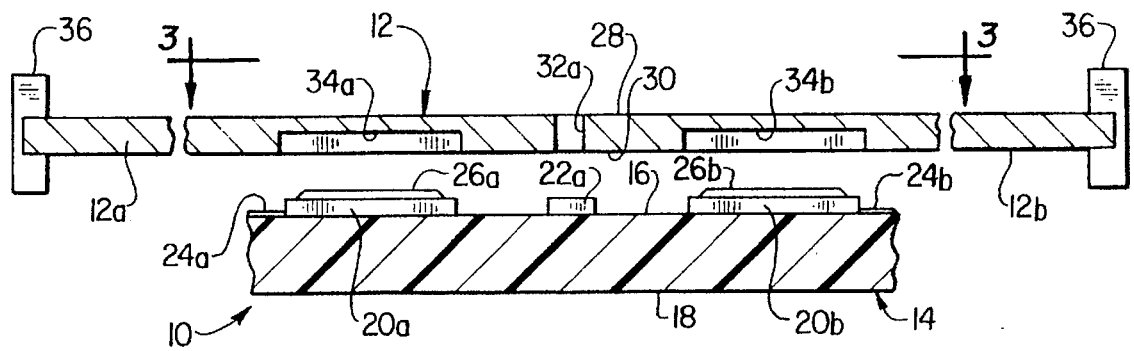
FIG. 2 is a cross-sectional view through the printed circuit board taken along line 2—2 of FIG. 1, and also cross-sectionally illustrates, in horizontally foreshortened form, a specially designed glue dot-applying stencil structure embodying principles of the present invention and operatively overlying the top side of the printed circuit board.

Illustrated in FIGS. 1 and 2 is a portion of a partially completed printed circuit board 10 that is further assembled using a specially designed glue dot stencil plate 12 embodying principles of the present invention. Circuit board 10 includes a generally planar dielectric substrate member 14 having top and bottom sides 16 and 18. Positioned on the top substrate side 16 are a spaced series of electrically conductive mounting pads 20 which are arranged in spaced apart aligned pairs such as the pairs 20a, 20b and 20c, 20d illustrated in FIG. 1. Representatively, the mounting pads in each spaced pair 20a, 20b and 20c, 20d thereof have elongated rectangular shapes and are in the illustrated longitudinally parallel relationship.

Also mounted on the top side 16 of the substrate member 14 are a spaced series of glue leveling pads 22 including the illustrated leveling pads 22a, 22b respectively centered between the mounting pad pairs 20a, 20b and 20c, 20d. Representatively, the glue leveling pads 22a, 22b have elongated rectangular shapes with lengths transverse to those of the mounting pads 20. The mounting pads 20 are coupled as indicated to electrically conductive traces 24a, 24b, 24c, 24d that extend across the top side 16 of the substrate member 14 and form a portion of the overall electronic circuitry of the board 10. Prior to the use of the specially designed stencil plate 12, quantities of solder paste 26a, 26b, 26c, 26d are respectively deposited on the top sides of the mounting pads 20a, 20b, 20c, 20d in a conventional manner.

Figure 3:
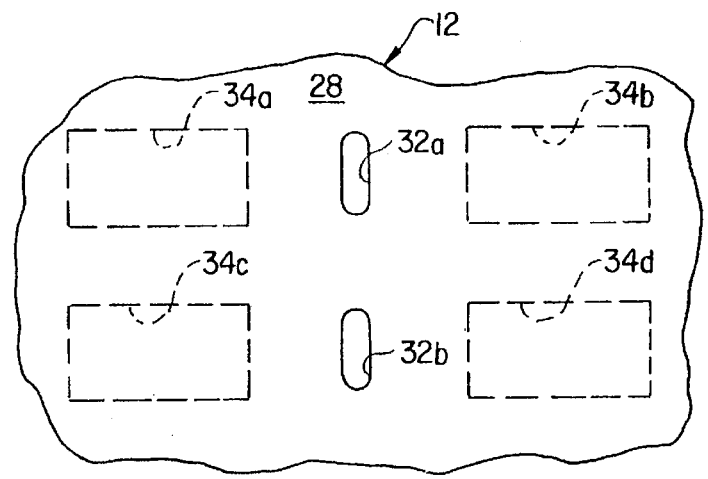
FIG. 3 is a top side elevational view of a portion of the stencil structure.

Referring now to FIGS. 2 and 3, the stencil plate 12 is preferably a relatively thin sheet of flexible metal (such as stainless steel) representatively having a thickness on the order of about 15 mils, a top side 28, a bottom side 30, and a pair of opposite side edge portions 12a, 12b. A spaced series of glue discharge openings 32, such as the openings 32a and 32b shown in FIG. 3, are formed through the stencil plate 12 with each of the openings 32 extending between the top and bottom stencil plate sides 38 and 30. The glue discharge openings 32 are located on the stencil plate 12 in a manner permitting them to be aligned with the previously described glue leveling pads 22. For example, the glue discharge openings 32a, 32b may be respectively aligned with the leveling pads 22a, 22b when the stencil plate 14 is in an overlying relationship with the substrate member 12 as depicted in FIG. 2. Like the rest of the glue discharge openings, glue discharge openings 32a, 32b are shaped similarly to their associated leveling pads 22a, 22b but are horizontally somewhat smaller.

Extending upwardly into the bottom side surface 30 of the stencil plate 12 are a spaced series of depressions or upsets 34 including the illustrated depression pair 34a, 34b and 34c, 34d. The vertical depth of each of the depressions 34 is on the order of about 10 mils. The depressions 34 are alignable with the mounting pads 20 when the stencil plate 14 is in an overlying relationship with the substrate member 12 as depicted in FIG. 2. Like the rest of the depressions 34, depression pairs 34a, 34b and 34c, 34d are shaped similarly to their associated mounting pads 20a, 20b and 20c, 20d but are horizontally somewhat larger.

Figure 4:
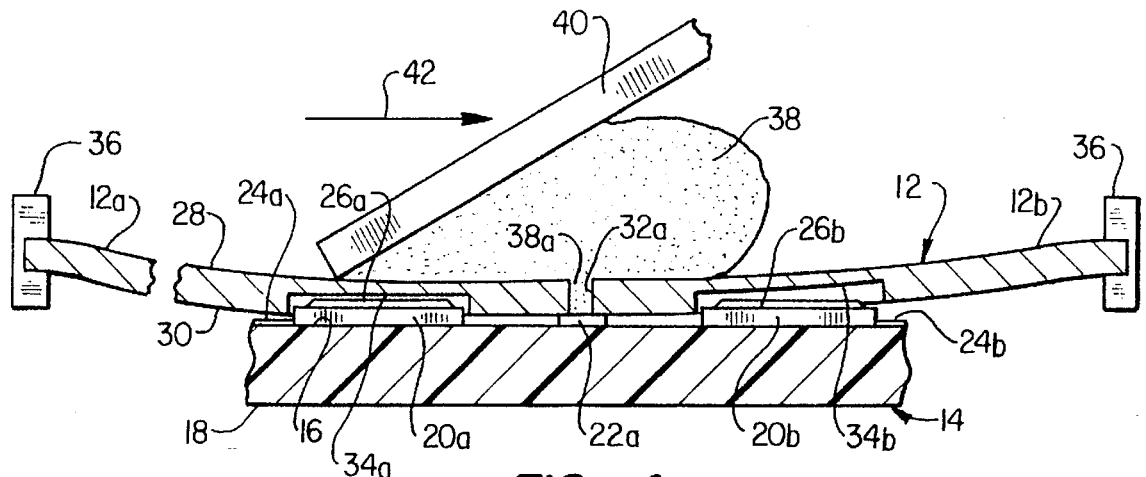
FIG. 4 is a view similar to that in FIG. 2 and illustrating the use of the stencil structure in applying glue dots to the circuit board.

With reference now to FIGS. 2 and 4, after the solder paste portions 26 have been deposited on the electrically conductive mounting pads 20, the stencil plate 12 and the substrate member 14 are positioned in a parallel, spaced apart relationship (see FIG. 2). In this relationship the top substrate side 16 faces the bottom side 30 of the stencil plate 12, with the opposite side edge portions 12a,12b of the stencil plate 12 being clamped in the schematically depicted support structures 36, the spaced series of underside stencil plate recesses 34 being horizontally aligned with the spaced series of mounting pads 20, and the spaced series of glue discharge openings 32 being horizontally aligned witch the spaced series of glue leveling pads 22.

Next, a quantity of glue 38 is appropriately deposited on the top side 28 of the stencil plate 12 along a left portion thereof as viewed in FIG. 4. A glue applying member representatively in the form of a suitable squeegee blade 40, angled rightly and upwardly as illustrated in FIG. 4, is then pressed downwardly against the top side 28 of the stencil plate 12, to the left of the glue 38 thereon, and moved rightwardly along the top side 28 as indicated by the arrow 42.

As the angled squeegee blade 40 is moved rightwardly along the top side 28 the vertical force component of the blade downwardly deflects the stencil plate 12, so that portions thereof with the glue discharge openings 32 therein are downwardly brought into contact with their associated glue leveling pads 22, while at the same time downwardly forcing small quantities 38a of the glue 38 through the glue discharge openings 32 onto the top sides of the underlying leveling pads 22. For example, as shown in FIG. 4, the bottom side of the glue discharge opening 32a is pressed downwardly against the top side of the underlying glue leveling pad 22a and a small glue quantity 38a is forced downwardly through the discharge opening 32a onto the underlying glue leveling pad 22a.

Importantly, and according to a key aspect of the present invention, as the squeegee blade 40 is forced rightwardly along the top side 28 of the stencil plate 12 and portions of the bottom side 30 of the stencil plate are downwardly brought into contact with rightwardly successive groups of the glue leveling pads 22, the solder paste portions 26 previously deposited on the top sides of the electrically conductive mounting pads 20 are left untouched, and thus undisturbed, by the downwardly deflected stencil plate 12 and are simply received, together with their associated mounting pads 20, within the stencil plate underside recesses 34 which provide vertical clearance for the mounting pads 20 and the solder past portions 26 thereon.

For example, with reference to FIG. 4, as the squeegee blade 40 rightwardly passes sequentially over the illustrated mounting pad 20a, glue leveling pad 22a and mounting pad 20b, (1) the mounting pad 20a and its associated solder paste quantity 26a upwardly enter the stencil plate recess 34a, (2) the glue quantity 38a is forced downwardly through the glue discharge opening 32a onto the top side of the underlying glue leveling pad 22a, and (3) the mounting pad 20b and its associated solder paste quantity 26b upwardly enter the stencil plate recess 34b.

Figure 5:
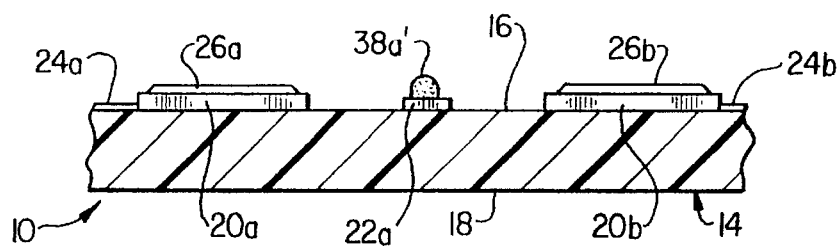
FIG. 5 cross-sectionally illustrates a portion of the circuit board after one of the glue dots has been applied thereto using the stencil structure.

After the squeegee blade 40 has rightly traversed the top side 28 of the stencil plate 12, the stencil plate 12 returns to its downwardly undeflected starting orientation (see FIG. 2). As illustrated in FIG. 5, glue dots 38a', formed from the glue quantities 38a previously forced downwardly through the spaced series of glue discharge openings 32, remain on the top sides of the glue leveling pads 22, and the solder paste portions 26 on the top sides of the mounting pads 20 remain undisturbed.

Figure 6:
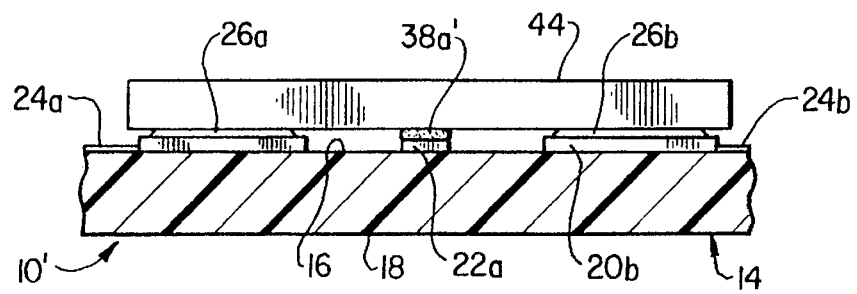
FIG. 6 is a view similar to that in FIG. 5, after completion of the circuit board by a final soldering process, with a representative electrical component operatively secured to the glue dot and solder paste portions shown in FIG. 5.

Next, electrical components are pressed downwardly against associated glue dots and solder paste portions to hold the components on the substrate in readiness for a final soldering process which will permanently mount the components on the board and operatively couple them to the board, circuitry. For example, with reference now to FIG. 6, a representative electrical component 44 is pressed downwardly against the solder paste portions 26a, 26b and the glue dot 38a' therebetween, and other components (not illustrated) are similarly pressed down onto their mounting pad and glue dot sets. The partially completed circuit board is then subjected to a final soldering process to form the completed printed circuit board 10', a portion of which is depicted in FIG. 6.

If desired, the stencil plate 12 could be alternatively utilized in an "on contact" mode in which it is placed directly against and parallel to the top substrate side 16 before and during the glue deposition step, with the mounting pads 20 received in the stencil plate side depressions 34, instead of initially positioning the stencil plate outwardly from the substrate and then resiliently deflecting the stencil plate toward the substrate during the glue deposition step.

The use of the specially designed stencil plate 12 to apply the glue dots 38a' provides several very substantial advantages over conventional printed circuit board fabrication techniques utilizing a needle type glue dot dispensing machine. For example, compared to needle type glue dot dispensing machines the use of the stencil plate 12 provides better shape consistency in the deposited glue dots, and greatly increases the glue dot application rate, thereby desirably decreasing the overall production time for a given quantity of finished printed circuit boards.f Additionally, the use of the specially designed stencil plate 12 substantially eliminates glue dot placement inaccuracies that can lead to the deposited glue "stringing" between adjacent conductive mounting pads and creating short circuits in the completed board. The problem of missing glue dots, caused by a clogged dispensing needle or an air bubble therein, is also substantially eliminated. Furthermore, and quite advantageously, a large manufacturing floor space requirement is eliminated by the use of the stencil plate 12, and no complex computer programming is required to use the stencil plate.

The foregoing detailed description is to be clearly understood as being given by way of illustration and example only, the spirit and scope of the present invention being limited solely by the appended claims.

What is claimed is:

1. A method of operatively mounting an electrical component on a spaced pair of electrically conductive mounting pads disposed on a first side of a partially completed circuit board, said method comprising the steps of:

depositing quantities of solder paste on the mounting pads;

providing a stencil plate having a spaced pair of recesses formed in a first side thereof, and a glue discharge opening disposed between and spaced apart from said pair of recesses and extending between the first and second sides of said stencil plate;

positioning said stencil plate in a glue depositing orientation in which said first stencil plate and circuit board sides are in a parallel, opposing relationship with said recesses being aligned with and receiving said mounting pads without appreciably disturbing the quantities of solder paste thereon;

forcing a quantity of glue through said glue discharge opening and onto the first circuit board side;

moving said stencil plate away from the circuit board in a manner leaving a glue dot on the first circuit board side; and positioning an electrical component on the first circuit board side by pressing the component against the solder paste quantities and said glue dot.

2. The method of claim 1 wherein:

said step of positioning said stencil plate is performed by the steps of positioning said stencil plate in a first orientation in which said first stencil plate and circuit board sides are in a spaced, parallel, opposing relationship with said recesses being aligned with said mounting pads, and resiliently deflecting said stencil plate from said first orientation thereof toward the circuit board to said glue depositing orientation in a manner causing the mounting pads to enter said recesses without appreciably disturbing the solder paste thereon.

3. The method of claim 1 wherein said steps of resiliently deflecting said stencil plate and forcing a quantity of glue through said glue discharge opening are performed by the steps of:

depositing glue on said second side of said stencil plate, and forcing a squeegee blade against said second side of said stencil plate, while holding said squeegee blade at an inclined angle relative to said stencil plate and moving said squeegee blade along said second side thereof, in a manner moving the deposited glue along said second side of said stencil plate and forcing a quantity of the deposited glue through said glue discharge opening toward said first circuit board side.

4. The method of claim 3 wherein said steps of resiliently deflecting said stencil plate and forcing a quantity of glue through said glue discharge opening include the step of holding opposite side edge portions of said stencil plate in stationary positions while forcing said squeegee blade against and moving it along said second stencil plate side.

5. The method of claim 1 wherein:

the partially completed circuit board has a substrate side surface on the first side thereof, the spaced pair of electrically conductive mounting pads being positioned on the substrate side surface, said method further comprises the step of positioning a glue leveling pad on the substrate side surface between the mounting pads, and said step of forcing a quantity of glue through said glue discharge opening is performed in a manner depositing the glue quantity onto said glue leveling pad.

6. The method of claim 1 further comprising the step of:

subjecting the partially completed circuit board to a soldering process to permanently anchor the electrical component thereon after performing said step of positioning said electrical component on the first circuit board side.

7. A method of fabricating a printed circuit board comprising the steps of:

providing a substrate member with a generally planar first side having disposed thereon (1) a mutually spaced series of electrically conductive mounting pads each having an outer side facing transversely away from said first side, and (2) a mutually spaced series of glue leveling pads each disposed between and spaced apart from the mounting pads in a different adjacent pair thereof;

depositing quantities of solder paste on said outer sides of said mounting pads;

providing a stencil plate having opposite first and second sides, a spaced series of glue discharge openings each extending through said stencil plate between said first and second sides thereof, and a spaced series of recesses formed in said first stencil plate side in a mutually spaced relationship with said glue discharge openings, said spaced series of recesses and glue discharge openings being respectively alignable with said mounting pads and said glue leveling pads when said stencil plate is disposed in a glue depositing orientation relative to said substrate member in which said first sides of said stencil plate and said substrate member are in a parallel, facing relationship, said recesses being sized and configured to receive said mounting pads and the deposited quantities of solder paste thereon without appreciably disturbing the solder paste;

disposing said stencil plate in said glue depositing orientation thereof relative to said substrate member; and depositing glue dots on said glue leveling pads by forcing a glue material through said glue discharge openings from said second side of said stencil plate.

8. The method of claim 7 further comprising the step of:

positioning electrical components on said first substrate member side by pressing each of said components against a pair of said solder paste quantities and a glue dot positioned therebetween.

9. The method of claim 8 further comprising the step of permanently securing the positioned electrical components to their associated mounting pads by subjecting them to a final soldering process.

10. The method of claim 7 wherein:

said step of disposing said stencil plate is performed by the steps of positioning said stencil plate in a first orientation in which said first stencil plate and substrate member sides are in a spaced, parallel, opposing relationship with said recesses being aligned with said mounting pads, and resiliently deflecting said stencil plate from said first orientation thereof toward the substrate member to said glue depositing orientation in a manner causing the mounting pads to enter said recesses without appreciably disturbing the solder paste thereon.

11. The method of claim 10 wherein:

said disposing step includes the step of holding opposite side edge portions of said stencil plate in fixed orientations relative to said substrate member.

12. The method of claim 11 wherein:

said step of depositing glue dots on said glue leveling pads is performed by the steps of:

depositing glue on said second side of said stencil plate, and forcing a squeegee blade against said second side of said stencil plate, while holding said squeegee blade at an inclined angle relative to said stencil plate and moving said squeegee blade along said second side thereof, in a manner moving the deposited glue along said second side of said stencil plate and forcing a quantities of the deposited glue through said glue discharge openings onto said glue leveling pads.

13. The method of claim 7 wherein said step of providing a stencil plate is performed by providing a stencil plate formed from stainless steel.

14. The method of claim 7 wherein said step of providing a stencil plate is performed by providing a stencil plate in which the depths of said recesses are approximately two thirds of the thickness of said stencil plate.

15. The method of claim 14 wherein said step of providing a stencil plate is performed by providing a stainless steel stencil plate having a thickness of approximately 15 mils.

16. The method of claim 7 wherein said step of providing a substrate member is performed by providing a substrate member in which said mounting pads and said glue leveling pads have generally rectangular configurations.

* * * * *